(12) United States Patent
Lee et al.

(10) Patent No.: US 6,982,485 B1
(45) Date of Patent: Jan. 3, 2006

(54) STACKING STRUCTURE FOR SEMICONDUCTOR CHIPS AND A SEMICONDUCTOR PACKAGE USING IT

(75) Inventors: Seon Goo Lee, Kyonggi-do (KR); Young Ho Kim, Seoul (KR); Choon Heung Lee, Kwangju (KR)

(73) Assignee: Amkor Technology, Inc., Chandler, AZ (US)

( * ) Notice: Subject to any disclaimer, the term of this patent is extended or adjusted under 35 U.S.C. 154(b) by 491 days.

(21) Appl. No.: 10/076,701

(22) Filed: Feb. 13, 2002

(51) Int. Cl.
H01L 23/48 (2006.01)
H01L 23/52 (2006.01)
H01L 23/28 (2006.01)
H01L 29/40 (2006.01)

(52) U.S. Cl. .................. 257/737; 257/738; 257/777; 257/780; 257/784; 257/787

(58) Field of Classification Search .............. 257/737, 257/738, 777, 780, 783, 784, 787
See application file for complete search history.

(56) References Cited

U.S. PATENT DOCUMENTS

| | | |
|---|---|---|
| 4,763,188 A | 8/1988 | Johnson |
| 5,012,323 A | 4/1991 | Faraworth |
| 5,025,306 A | 6/1991 | Johnson et al. |
| 5,291,061 A | 3/1994 | Ball |
| 5,323,060 A * | 6/1994 | Fogal et al. .................. 257/777 |
| 5,328,079 A * | 7/1994 | Mathew et al. ........... 228/180.5 |
| 5,347,429 A | 9/1994 | Kohno et al. |
| 5,422,435 A * | 6/1995 | Takiar et al. ............... 174/52.4 |
| 5,463,253 A | 10/1995 | Waki et al. |
| 5,474,957 A | 12/1995 | Urushima |
| 5,474,958 A | 12/1995 | Djennas et al. |
| 5,495,398 A | 2/1996 | Takiar et al. |
| 5,502,289 A | 3/1996 | Takiar et al. |
| 5,541,450 A * | 7/1996 | Jones et al. .................. 257/697 |
| 5,552,966 A * | 9/1996 | Nagano ....................... 361/813 |

(Continued)

OTHER PUBLICATIONS

Abstract 62-126661, English Abstract of Japanese Patent Application No. 60-267712, Published Jun. 8, 1987, Inventor Hiromi Sakata.

(Continued)

Primary Examiner—David E. Graybill
(74) Attorney, Agent, or Firm—Weiss, Moy & Harris, P.C.

(57) ABSTRACT

A semiconductor package and method of producing the same has a substrate having a resin layer with first and second surfaces. A plurality of electrically conductive patterns are formed on the resin layer. An aperture is also formed at the center of the substrate. A first semiconductor chip has first and second surfaces. The second surface of the first semiconductor chip has a plurality of input/output pads formed thereon. The first semiconductor chip is placed in the aperture of the substrate. A plurality of first conductive wires connect the input/output pads of the first semiconductor chip to the electrically conductive patterns formed on the second surface of the resin layer. A second semiconductor chip having first and second surfaces is coupled to the first semiconductor chip. The second surface of the second semiconductor chip has a plurality of input/output pads formed thereon. A plurality of second conductive wires connect the input/output pads of the second semiconductor chip to the electrically conductive patterns formed on the second surface of the resin layer. An encapsulate is used to encapsulate the aperture of the substrate, the first and second semiconductor chips, and the first and second conductive wires. A plurality of conductive balls are coupled to the electrically conductive patterns formed on the second surface of the resin layer of the substrate.

19 Claims, 20 Drawing Sheets

U.S. PATENT DOCUMENTS

| | | | |
|---|---|---|---|
| 5,581,498 A | 12/1996 | Ludwig et al. | |
| 5,639,695 A * | 6/1997 | Jones et al. | 438/126 |
| 5,646,830 A * | 7/1997 | Nagano | 361/813 |
| 5,674,785 A | 10/1997 | Akram et al. | |
| 5,689,135 A | 11/1997 | Ball | |
| 5,696,031 A | 12/1997 | Wark | |
| 5,715,147 A | 2/1998 | Nagano | |
| 5,721,452 A | 2/1998 | Fogal et al. | |
| 5,735,030 A * | 4/1998 | Orcutt | 29/860 |
| 5,739,581 A | 4/1998 | Chillara et al. | |
| 5,739,585 A | 4/1998 | Akram et al. | |
| 5,773,884 A * | 6/1998 | Andros et al. | 257/707 |
| 5,798,014 A | 8/1998 | Weber | |
| 5,815,372 A | 9/1998 | Gallas | |
| 5,835,355 A | 11/1998 | Dordi | |
| 5,843,808 A * | 12/1998 | Karnezos | 438/121 |
| 5,866,949 A | 2/1999 | Schueller | |
| 5,886,412 A | 3/1999 | Fogal et al. | |
| 5,894,108 A | 4/1999 | Mostafazadeh et al. | |
| 5,903,052 A | 5/1999 | Chen et al. | |
| 5,905,634 A * | 5/1999 | Takeda et al. | 361/704 |
| 5,920,117 A * | 7/1999 | Sono et al. | 257/675 |
| 5,952,611 A | 9/1999 | Eng et al. | |
| 5,972,736 A * | 10/1999 | Malladi et al. | 438/118 |
| 5,973,403 A | 10/1999 | Wark | |
| 6,005,778 A * | 12/1999 | Spielberger et al. | 361/770 |
| 6,013,948 A | 1/2000 | Akram et al. | |
| RE36,613 E | 3/2000 | Ball | |
| 6,034,427 A | 3/2000 | Lan et al. | |
| 6,043,559 A * | 3/2000 | Banerjee et al. | 257/700 |
| 6,051,886 A * | 4/2000 | Fogal et al. | 257/777 |
| 6,057,598 A | 5/2000 | Payne et al. | |
| 6,060,778 A | 5/2000 | Jeong et al. | |
| 6,072,243 A | 6/2000 | Nakanishi | |
| 6,080,264 A | 6/2000 | Ball | |
| 6,081,426 A * | 6/2000 | Takeda et al. | 361/704 |
| 6,118,176 A | 9/2000 | Tao et al. | |
| 6,122,171 A | 9/2000 | Akram et al. | |
| 6,127,833 A | 10/2000 | Wu et al. | |
| 6,133,637 A | 10/2000 | Hikita et al. | |
| 6,140,149 A | 10/2000 | Wark | |
| 6,157,080 A | 12/2000 | Tamaki et al. | |
| 6,160,705 A | 12/2000 | Stearns et al. | |
| 6,163,076 A | 12/2000 | Lee et al. | |
| 6,172,419 B1 * | 1/2001 | Kinsman | 257/737 |
| 6,184,463 B1 | 2/2001 | Panchou et al. | |
| 6,214,641 B1 | 4/2001 | Akram | |
| 6,215,182 B1 * | 4/2001 | Ozawa et al. | 257/723 |
| 6,215,193 B1 | 4/2001 | Tao et al. | |
| 6,235,554 B1 | 5/2001 | Akram et al. | |
| 6,252,305 B1 | 6/2001 | Lin et al. | |
| 6,258,626 B1 | 7/2001 | Wang et al. | |
| 6,313,519 B1 * | 11/2001 | Gainey et al. | 257/676 |
| 6,313,522 B1 * | 11/2001 | Akram et al. | 257/686 |
| 6,316,727 B1 * | 11/2001 | Liu | 174/52.4 |
| 6,316,838 B1 * | 11/2001 | Ozawa et al. | 257/778 |
| 6,326,696 B1 | 12/2001 | Horton et al. | |
| 6,333,562 B1 * | 12/2001 | Lin | 257/777 |
| 6,359,340 B1 | 3/2002 | Lin et al. | |
| 6,365,966 B1 | 4/2002 | Chen et al. | |
| 6,376,904 B1 * | 4/2002 | Haba et al. | 257/686 |
| 6,387,728 B1 | 5/2002 | Pai et al. | |
| 6,395,578 B1 * | 5/2002 | Shin et al. | 438/106 |
| 6,400,007 B1 * | 6/2002 | Wu et al. | 257/686 |
| 6,407,456 B1 * | 6/2002 | Ball | 257/777 |
| 6,414,396 B1 * | 7/2002 | Shim et al. | 257/778 |
| 6,437,449 B1 * | 8/2002 | Foster | 257/777 |
| 6,441,496 B1 * | 8/2002 | Chen et al. | 257/777 |
| 6,445,594 B1 * | 9/2002 | Nakagawa et al. | 361/776 |
| 6,452,278 B1 * | 9/2002 | DiCaprio et al. | 257/777 |
| 6,461,897 B2 | 10/2002 | Lin et al. | |
| 6,495,773 B1 * | 12/2002 | Nomoto et al. | 174/260 |
| 6,503,776 B2 * | 1/2003 | Pai et al. | 438/106 |
| 6,552,416 B1 * | 4/2003 | Foster | 257/666 |
| 6,555,902 B2 * | 4/2003 | Lo et al. | 257/686 |
| 6,555,917 B1 * | 4/2003 | Heo | 257/777 |
| 6,561,411 B2 * | 5/2003 | Lee | 228/180.5 |
| 6,563,205 B1 * | 5/2003 | Fogal et al. | 257/686 |
| 6,564,449 B1 * | 5/2003 | Tsai et al. | 29/830 |
| 6,607,943 B1 * | 8/2003 | Kinsman | 438/124 |
| 6,621,155 B1 * | 9/2003 | Perino et al. | 257/686 |
| 6,621,169 B2 * | 9/2003 | Kikuma et al. | 257/780 |
| 6,657,290 B2 * | 12/2003 | Fukui et al. | 257/686 |
| 6,759,737 B2 * | 7/2004 | Seo et al. | 257/686 |
| 6,762,078 B2 * | 7/2004 | Shin et al. | 438/123 |
| 6,784,534 B1 * | 8/2004 | Glenn et al. | 257/704 |
| 6,787,926 B2 * | 9/2004 | Chen et al. | 257/784 |
| 6,790,710 B2 * | 9/2004 | McLellan et al. | 438/122 |
| 6,798,049 B1 * | 9/2004 | Shin et al. | 257/678 |
| 6,798,063 B2 * | 9/2004 | Kinsman | 257/737 |
| 2002/0047213 A1 * | 4/2002 | Komiyama et al. | 257/777 |
| 2002/0079570 A1 * | 6/2002 | Ho et al. | 257/697 |
| 2002/0153615 A1 * | 10/2002 | Komiyama et al. | 257/777 |

OTHER PUBLICATIONS

Abstract 4-56262, English Abstract of Japanese Patent Application No. 2-167207, Published Feb. 24, 1992, Inventor Susumu Sanai.

Abstract 63-244654, English Abstract of Japanese Patent Application No. 62-76176, Published Oct. 12, 1988, Inventor Hiromichi Sawatani.

Publication No. 05136323, English Abstract of Japanese Patent Application No. 03297304, Published Jun. 1, 1993, Inventor Yoshino Susumu and Chikama Hiroki.

Publication No. 05109975, English Abstract of Japanese Patent Application No. 03264522, Published Apr. 30, 1993, Inventor Ryuji et al.

Patent No. JP61117858, English Abstract, Published Jun. 5, 1986, Inventor Takahashi Hidekazu.

Publication No. 04028260, English Abstract of Japanese Patent Application No. 02133391, Published Jan. 30, 1992, Inventor Nakano Katsuhiro.

Publication No. 04116859 English Abstract of Japanese Patent Application No. 02237713, Published Apr. 17, 1992, Inventor Sawano Hiroshi.

Publication No. 04096358, English Abstract of Japanese Patent Application No. 02211544, Published Mar. 27, 1992, Inventor Fukui Yuichi.

Publication No. 05013665, English Abstract of Japanese Patent Application No. 03183498, Published Jan. 22, 1993, Inventor Yamauchi Fushimi and Kawazumi Masaru.

Patent No. JP1028856, English Abstract, Published Jan. 31, 1989, Inventor Takeuchi Ryosuke.

Publication No. 01099248, English Abstract of Japanese Patent Application No. 62258632, Published Apr. 18, 1989, Inventor Kosugi Ryuichi.

Patent No. JP60182731, English Abstract, Published Sep. 18, 1985, Inventor Kawaguchi Tamotsu.

Patent No. JP56062351, English Abstract, Published May 28, 1981, Inventor Sano Yuji.

Patent No. JP3169062 English Abstract, Published Jul. 22, 1991, Inventor Goto Seiji.

Publication No. 10-256470, English Abstract of Japanese Patent Application No. 09-055176, Published Sep. 25, 1998, Inventor Tsubonoya Makoto.

Patent No. JP1071162, English Abstract, Published Mar. 16, 1989, Inventor Wantanabe Masayuki.

Abstract 5-75015, English Abstract of Japanese Patent Application No. 3-234485, Published Mar. 26, 1993, Inventor Akio Goto.

Publication No. 0503201, European Patent Application No. 91311873.3, Published Sep. 16, 1992, Inventor Kabushiki Kaisha.

Patent No. JP64001269, English Abstract, Published Jan. 5, 1989, Inventor Watanabe Masayuki.

Patent No. JP4056252, English Abstract, Published Feb. 24, 1992, Inventor Sanai Susumu.

Patent No. JP62126661, English Abstract, Published Jun. 8, 1987, Inventor Sakata Hiromi.

Patent No. JP63128736, English Abstract, Published Jun. 1, 1988, Inventor Nishimura Yoshiro.

* cited by examiner

STACKING STRUCTURE FOR SEMICONDUCTOR CHIPS AND A SEMICONDUCTOR PACKAGE USING IT

BACKGROUND OF THE INVENTION

1. Field of the Invention

The present invention relates to a semiconductor package and, more particularly, to a semiconductor package in which a plurality of semiconductor chips are stacked.

2. Description of the Related Art

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die vertically in an IC package. Stacking multiple die will maximize function and efficiency of the semiconductor package.

Conventionally, a semiconductor package is constructed in such a manner that semiconductor chips sawed from a wafer are electrically connected with a substrate and, simultaneously, connected with a motherboard, being encapsulated up with an encapsulant. Recently, attempts have been made to stack a plurality of semiconductor chips serving as main components of the semiconductor package to maximize the performance of the semiconductor package. A recent semiconductor package has multifunction and high performance owing to combination of a flash memory chip and a SRAM device, combination of a logic chip and a flash memory chip, combination of a digital chip and an analog chip or combination of a digital signal processor and a flash memory chip, for example. Furthermore, the semiconductor package having the semiconductor chips stacked therein is widely used for cellular phones, personal digital assistants, camcorders, PCs, routers and other portable products because it can satisfy a high memory density while having a small volume.

However, existing stack type semiconductor packages have the limitation of requiring an extraordinarily thick adhesive layer between the chips so as to prevent the conductive wire of the lower chip from contacting the bottom surface of the upper chip and thus creating an electrical short.

Therefore, a need existed to provide a device and method to overcome the above problem.

SUMMARY OF THE INVENTION

A semiconductor package and method of producing the same has a substrate having a resin layer with first and second surfaces. A plurality of electrically conductive patterns are formed on the resin layer. An aperture is formed at the center of the substrate. A first semiconductor chip has first and second surfaces. The second surface of the first semiconductor chip has a plurality of input/output pads formed thereon. The first semiconductor chip is placed in the aperture of the substrate. A plurality of first conductive wires connect the input/output pads of the first semiconductor chip to the electrically conductive patterns formed on the second surface of the resin layer. A second semiconductor chip having first and second surfaces is coupled to the first semiconductor chip. The second surface of the second semiconductor chip has a plurality of input/output pads formed thereon. A plurality of second conductive wires connect the input/output pads of the second semiconductor chip to the electrically conductive patterns formed on the second surface of the resin layer. An encapsulate is used to encapsulate the aperture of the substrate, the first and second semiconductor chips, and the first and second conductive wires. A plurality of conductive balls are coupled to the electrically conductive patterns formed on the second surface of the resin layer of the substrate.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION OF THE INVENTION

Figure 1A:
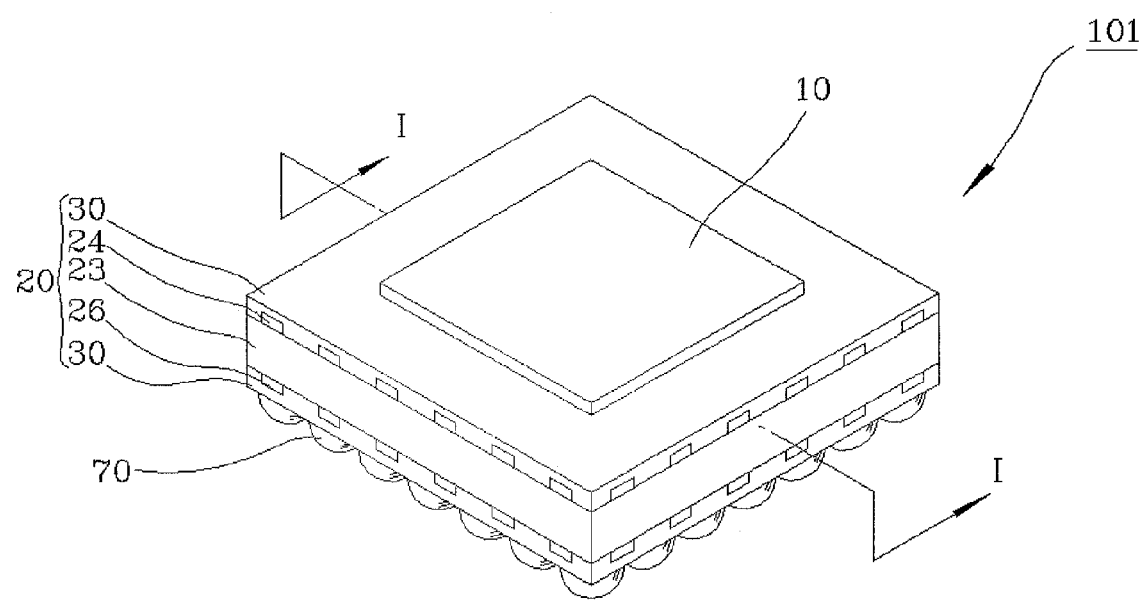
FIG. 1A is an elevated perspective view of a semiconductor package according to an embodiment of the present invention.
Figure 1B:
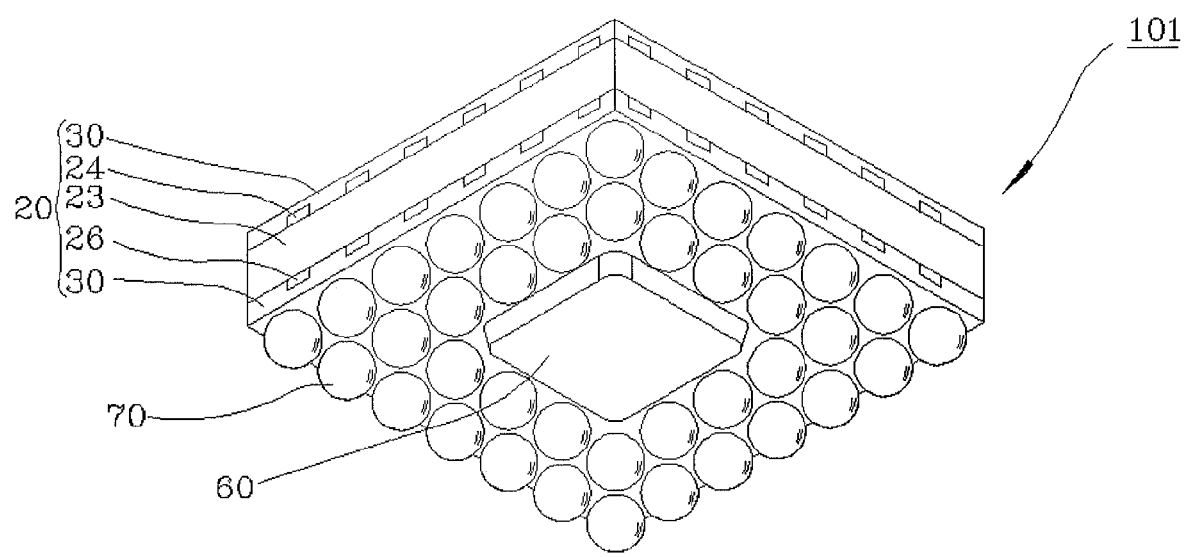
FIG. 1B is an elevated bottom view of a semiconductor package according to an embodiment of the present invention.

Referring to FIGS. 1A, 1B, 2A and 2B, a semiconductor package 101 according to an embodiment of the present invention is illustrated. As shown in the FIGS. 1A, 1B, 2A and 2B, the semiconductor package 101 has a substrate 20 with a planar plate shape, having an aperture 31 at the center thereof. The substrate 20 has a resin layer 23 including first and second surfaces 21 and 22. These first and second surfaces 21 and 22 of the resin layer 23 have a plurality of electrically conductive patterns 24 and 26 formed thereon. Electrically conductive patterns 24 and 26 of the first and second surfaces 21 and 22 are connected to each other through a conductive via 27. The aperture 31 is formed at the center of the resin layer 23 with its width being wider than that of a semiconductor chip that will be explained later.

The first and second surfaces 21 and 22 of the resin layer 23 and the electrically conductive patterns 24 and 26 are coated with a solder mask 30 to be protected from external environments. The solder mask 30 is not coated on a portion of the electrically conductive patterns 24 and 26 to which a conductive wire will be bonded or a conductive ball is fused. This will be explained later. Conventionally, the portion to which the conductive wire is bonded is called a bond finger 28 and the portion to which the conductive ball is fused is called a ball land 29. In addition, the solder mask 30 is not formed on a certain portion of the electrically conductive patterns 24 of the first surface 21 of the resin layer 23 so that a conductive thin film 10 which will be described below can be connected to the electrically conductive pattern 24. This portion is defined as a land 25 in this description.

A conductive thin film 10 having the shape of a kind of plate is formed on one side of the substrate 20 to cover the aperture 31. In addition, the conductive thin film 10 is electrically connected to the electrically conductive patterns 24 formed on the first surface 21 of the resin layer 23. That is, the conductive thin film 10 is connected with the electrically conductive patterns 24 through the land 25 on which the solder mask 30 is not being coated. This conductive thin film 10 can be conventionally formed of Cu, Al, Ag, Ag-filled epoxy or its equivalent but the material is not limited thereto.

A first semiconductor chip 1 having a width smaller than that of the aperture 31 is located in the aperture 31 of the substrate 20. In other words, the first semiconductor chip 1 is placed on the surface of the conductive thin film 10 covering one side of the aperture 31. The first semiconductor chip 1 has first and second surfaces, 1a and 1b which are approximately planar. A plurality of input/output pads 1c are formed on the second surface 1b and a conductive ball 42 is fused to each of the input/output pads 1c. The conductive ball 42 is conventionally formed of gold, solder or its equivalent, but the material is not limited thereto.

Each of the electrically conductive patterns 26 formed on the second surface 22 of the resin layer 23 of the substrate 20 is connected with the conductive ball 42 formed on each input/output pad of the first semiconductor chip 1 through a first conductive wire 40. Specifically, one end of the first conductive wire 40 is ball-bonded 41 to the bond finger 28 of the electrically conductive pattern 26 and the other end is stitch-bonded 43 to the conductive ball 42. This wire bonding is generally called stand off stitch bonding (SSB).

The aforementioned SSB has an advantage of minimizing the height of the maximum curved portion of the first conductive wire formed at the second surface 1b of the first semiconductor chip 1. That is, the maximum curved portion of the first conductive wire is not placed at the first semiconductor chip 1 but at the substrate 20. In other words, the maximum curved portion of the first conductive wire 40 is not located on the second surface 1b of the first semiconductor chip 1 but on the surface of the bond finger 28 of the electrically conductive pattern 26. Here, the first conductive wire may be formed of Au, Al, Cu or its equivalent but the material is not limited thereto.

An adhesive layer 4 with a predetermined thickness is attached onto the second surface 1b of the first semiconductor chip 1. The adhesive layer 4 can be a tape, epoxy or its equivalent, but the material is not limited thereto. The tape is generally used as the adhesive layers 4.

Figure 2A:
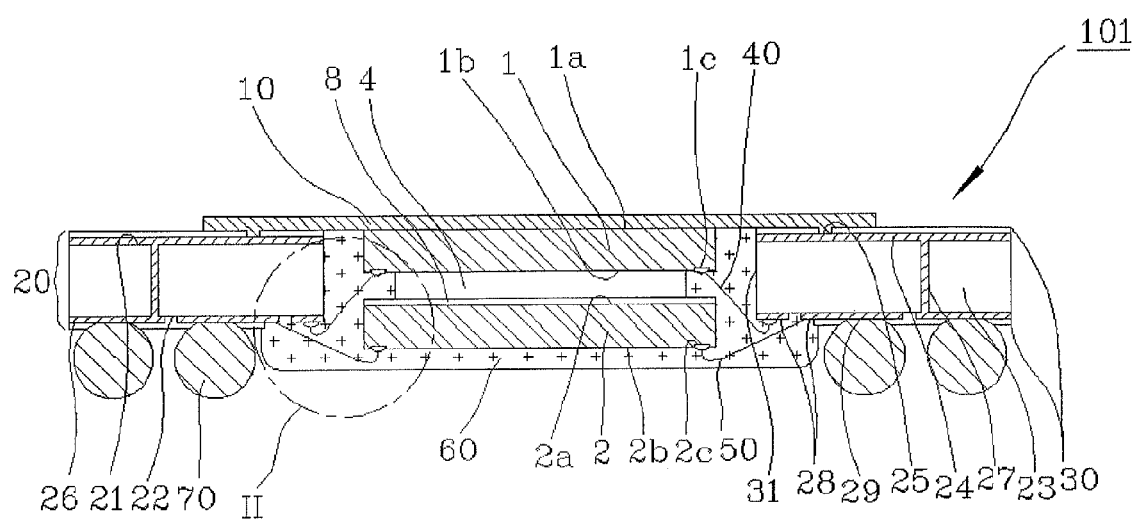
FIG. 2A is a cross-sectional view taken along the line I—I of FIG. 1A.
Figure 2B:
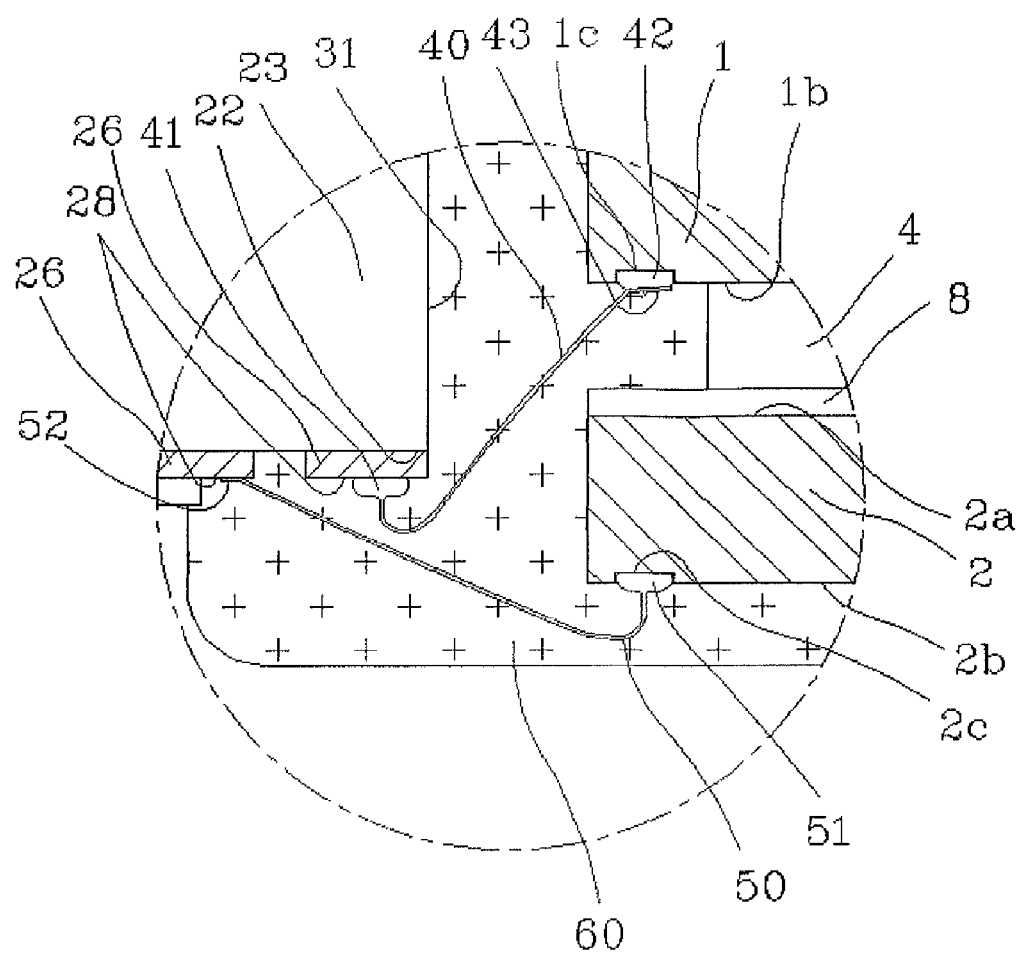
FIG. 2B is an extended cross-sectional view of the portion II of FIG. 2A.
Figure 2C:
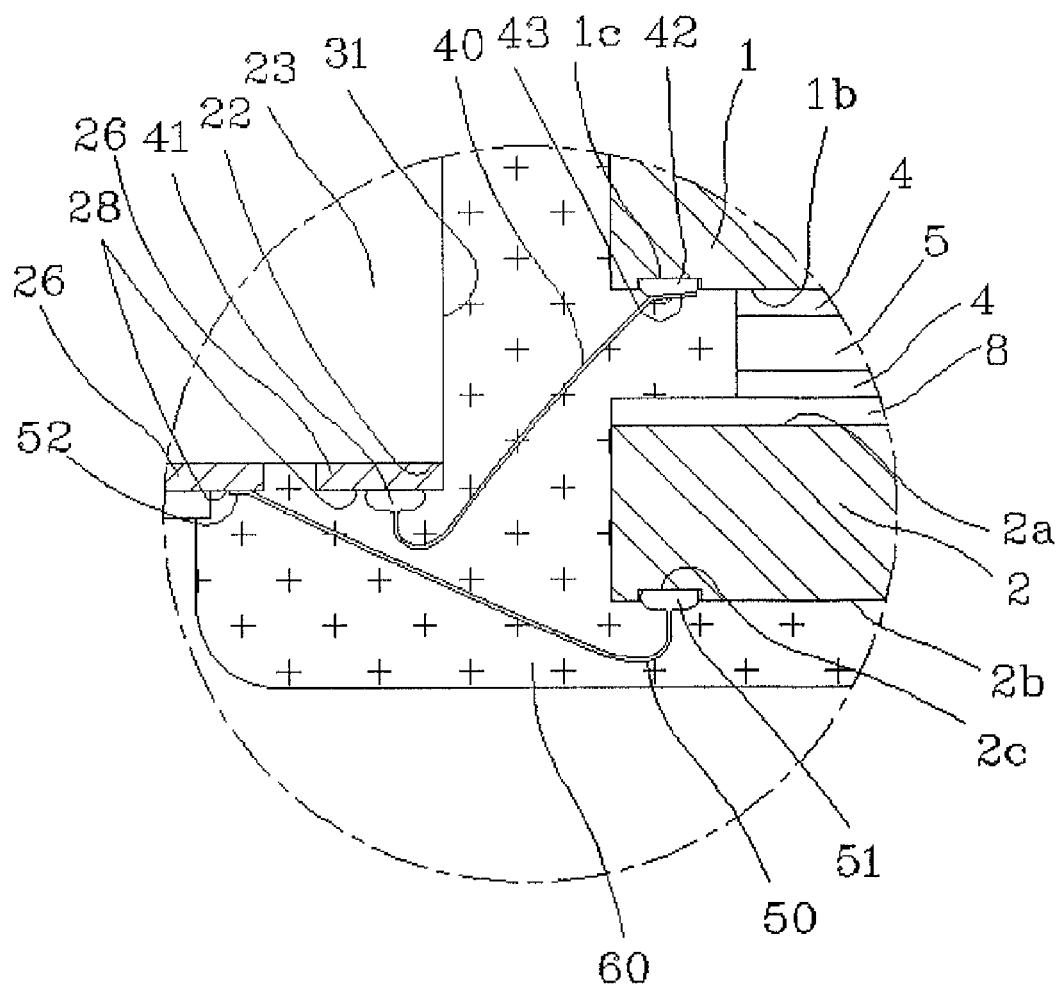
FIG. 2C is an extended cross-sectional view of a semiconductor package according to another embodiment of the present invention.

Referring to FIG. 2C, an extended cross-sectional view of a semiconductor package according to another embodiment of the present invention is illustrated.

As shown in the FIG. 2C, instead of the adhesive layer 4, silicon 5 can come into contact with the second surface 1b of the first semiconductor chip 1. Here, the adhesive layer 4 can be formed on a top and bottom surface of the silicon 5. A dummy wafer sawed to a predetermined size can be used as the silicon 5.

A second semiconductor chip 2 is attached onto the adhesive layer 4. The second semiconductor chip 2 has first and second surfaces 2a and 2b that are approximately planar, and a plurality of input/output pads 2c are formed on the edge of the second surface 2b. An insulating layer 8 is attached onto the first surface 2a of the second semiconductor chip 2. The insulating layer 8 has the same area as that of the first surface 2a of the second semiconductor chip 2. This insulating layer 8 uses an insulating adhesive film having a predetermined degree of elasticity so that the first conductive wire 40 is not damaged or short-circuited even if it comes into contact with the insulating layer 8.

Furthermore, the insulating layer 8 is coated or printed on the overall surface of one side of the wafer (the first surface 2a of the second semiconductor chip 2) in advance. Specifically, the insulating layer 8 is formed on one side of the wafer through coating or printing, and then the wafer is sawed into a plurality of second semiconductor chips 2 so that the insulating layer 8 is provided together with the second semiconductor chip 2. The insulating layer 8 can also be independently formed on each second semiconductor chip.

The distance between the first and second semiconductor chips 1 and 2 is generally around 3–4 mil to a minimum so that a total thickness of the semiconductor package is much thinner. That is, the total thickness of the adhesive layer 4 and the insulating layer 8 can reduce by about 3–4 mil at a minimum by using SSB.

Meantime, the probability of contact of the first conductive wire 40 and the first surface 2a of the second semiconductor chip 2 (specifically, the insulating layer 8) is decreased remarkably, compared to the conventional case. That is, the maximum curved portion of the first conductive wire 40 is not placed at the first semiconductor chip side but at the substrate side so that the probability of contact of the first conductive wire 40 and the insulating layer 8 is reduced. This advantage becomes powerful when the thickness of the substrate 20 is larger than that of the first semiconductor chip 1. This is because the maximum curved portion of the first conductive wire is formed at the first semiconductor chip side to increase the probability of contact of the first conductive wire 40, and the second semiconductor chip 2 if the first conductive wire 40 is boned using the conventional normal wire bonding even when the substrate 20 is thicker than the first semiconductor chip.

The electrically conductive pattern 26 of the substrate 20, specifically, the bond finger 28 of the electrically conductive pattern 26 formed on the second surface 22 of the resin layer 23 is connected to the input/output pad 2c of the second semiconductor chip 2 through a second conductive wire 50. One end of the second conductive wire 50 is ball-bonded 51 to the input/output pad 2c of the second semiconductor chip 2 and the other end is stitch-boned 52 to the bond finger 28 of the electrically conductive pattern 26 of the substrate 20. This type of wire bonding is called normal wire bonding. In this case, the maximum curved portion of the second conductive wire 50 is located on the second surface 2b of the second semiconductor chip 2.

The aperture 31 of the substrate is filled with an encapsulant to construct an encapsulated portion 60 with a predetermined form. The encapsulant encapsulates up the first and second semiconductor chips 1 and 2, the first and second conductive wires 40 and 50 and the adhesive layer 4 to form the encapsulated portion 60 having the predetermined shape and, simultaneously, to protect them from external environments.

Finally, a conductive ball 70, such as solder ball, is fused to the electrically conductive pattern 26 of the substrate 20, specifically, the ball land 29 of the electrically conductive pattern 26 formed on the second surface 22 of the resin layer 23. The conductive ball 70 is fused to a mother board (not shown) in the subsequent process to transmit electric signals of the first and second semiconductor chips 1 and 2 to the mother board or deliver electric signals of the mother board to the first and second semiconductor chips 1 and 2. The conductive ball 70 is formed in a manner that its diameter is larger than the thickness of the part of the encapsulated portion 60 that is protruded downward so that the semiconductor package can be easily mounted on the mother board.

As described above, in the semiconductor package 101 of the present invention, the bond finger 28 of the electrically conductive pattern 26 of the substrate 20 is connected to the input/output pad 1c of the first semiconductor chip 1 through SSB to minimize the mutual interference or short-circuit between the first conductive wire 40 and the second semiconductor chip 2. That is, the maximum curved portion of the first conductive wire 40 is not formed on the second surface 1b of the first semiconductor chip 1 but on the electrically conductive pattern 26 of the substrate 20, to deteriorate the probability of contact of the first conductive wire 40 and the second semiconductor chip 2.

In addition, the conductive thin film 10 is naturally grounded on the motherboard according to the electrically conductive pattern 24, the conductive via 27, the electrically conductive pattern 26 and the conductive ball 70 to widely absorb external electromagnetic waves. That is, the conductive thin film 10 protects the first and second semiconductor chips 1 and 2 from external electromagnetic waves. Accordingly, electrical noise is removed when the first and second semiconductor chips 1 and 2 and the electrically conductive patterns 24 and 26 operate thereby improving the electrical performance of the semiconductor package 101. Furthermore, the first semiconductor chip 1 directly comes into contact with the wide conductive thin film 10 so that its heat radiating performance is also improved.

Figure 3A:
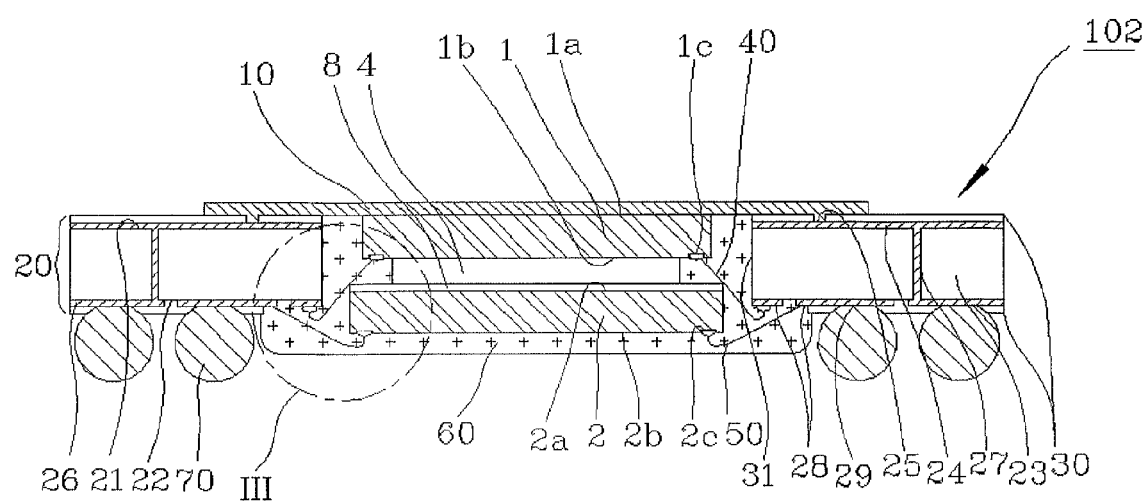
FIG. 3A is a cross-sectional view of a semiconductor package according to another embodiment of the present invention.
Figure 3B:
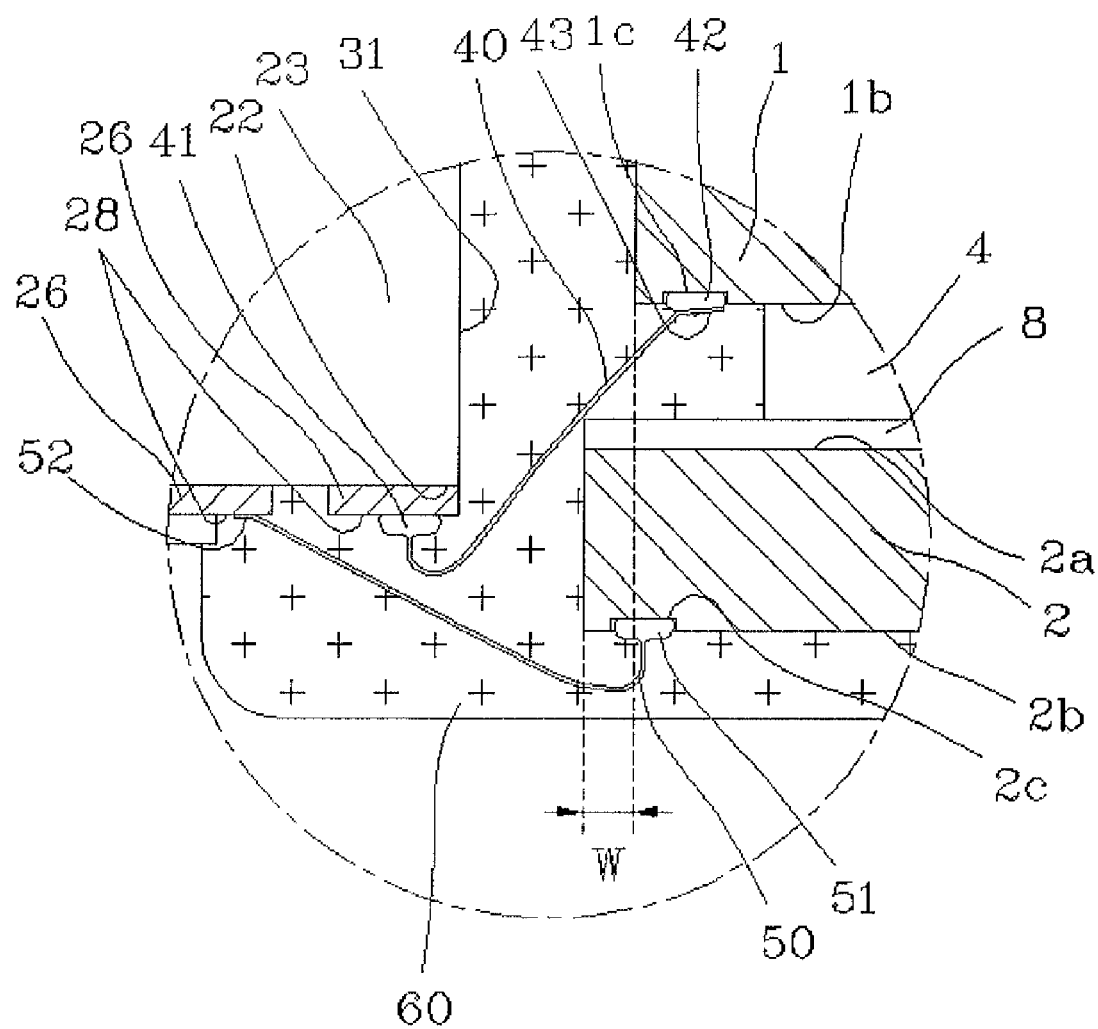
FIG. 3B is an extended cross-sectional view of the portion III of FIG. 3A.

Referring to FIGS. 3A and 3B, a semiconductor package 102 according to another embodiment of the present invention is illustrated. The semiconductor package 102 is similar to the aforementioned semiconductor package 101 so that only the difference between them will be explained below.

As shown in the FIGS. 3A and 3B, the horizontal width of the second semiconductor chip 2 can be wider than that of the first semiconductor chip 1. Specifically, the second semiconductor chip 2 can be wider than the first semiconductor chip 1 in the horizontal direction by the width W. This is because the first conductive wire 40 connecting the bond finger 28 of the electrically conductive pattern 26 of the substrate 20 to the input/output pad 1c of the first semiconductor chip 1 is bonded through SSB. That is, the maximum curved portion of the first conductive wire 40 is not formed at the second surface 1b of the first semiconductor chip 1 but at the bond finger 28 of the electrically conductive pattern 26 of the substrate 20. If the normal wire bonding is carried out between the first semiconductor chip 1 and the substrate 20, it is impossible to use the second semiconductor chip 2 that is larger than the first semiconductor chip 1. This is because the first conductive wire 40 easily comes into contact with the first surface 2a of the second semiconductor chip 2 due to the maximum curved portion of the first conductive wire 40 formed on the first semiconductor chip 1.

Figure 4A:
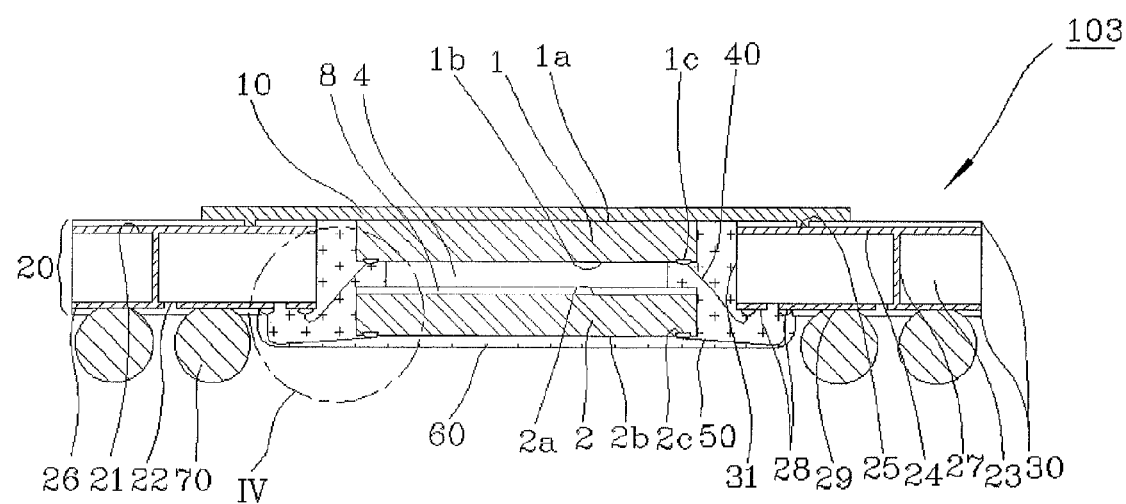
FIG. 4A is a cross-sectional view of a semiconductor package according to another embodiment of the present invention.
Figure 4B:
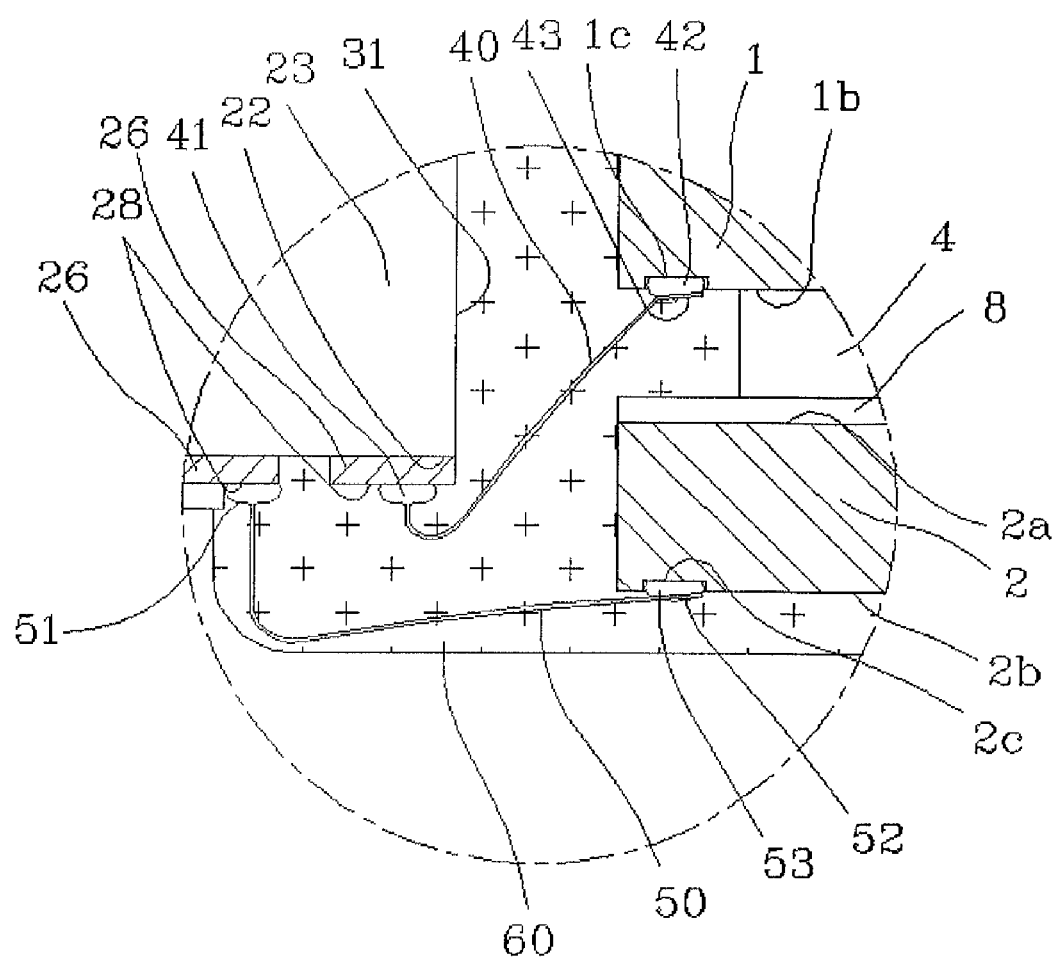
FIG. 4B is an extended cross-sectional view of the portion IV of FIG. 4A.
Figure 5:
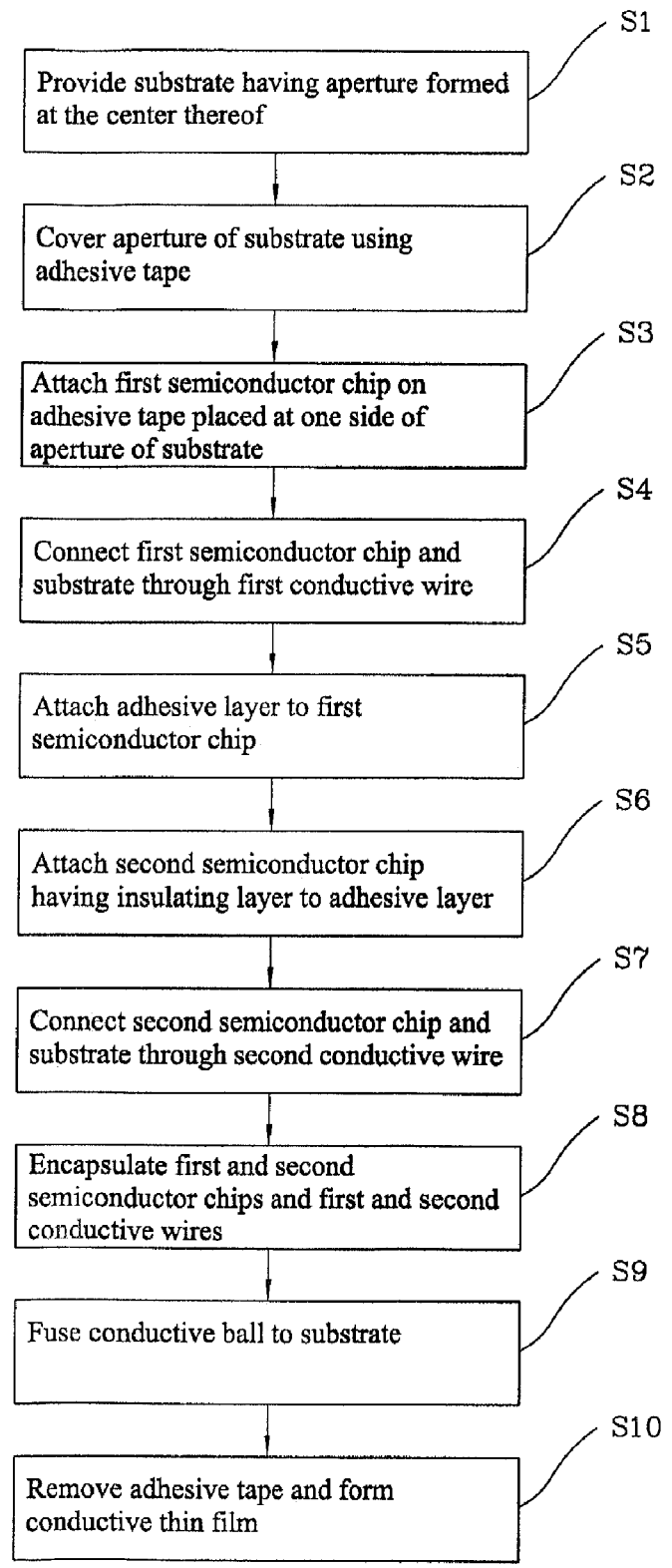
FIG. 5 is a flow chart showing an example of one embodiment of a method of manufacture according to the present invention.

Referring to FIGS. 4A and 4B, a semiconductor package 103 according to another embodiment of the present invention is illustrated. The semiconductor package 103 is similar to the aforementioned semiconductor package 101 so that only the difference between them will be explained below.

As shown in the FIGS. 4A and 4B, one end of the second conductive wire 50 is ball-bonded 51 to the bond finger 28 of the electrically conductive pattern 26 of the substrate 20 and the other end is stitch-bonded 52 to the input/output pad 2c of the second semiconductor chip 2. Of course, a conductive ball 53 is formed on the input/output pad 2c of the second semiconductor chip 2 in advance so that the other end of the second conductive wire 50 can be stitch-bonded 52 to the conductive ball 53. In this embodiment, the thickness of the encapsulated portion 60 encapsulating up the second semiconductor chip 2 can be reduced more and the conductive ball 70 fused to the ball land 29 of the electrically conductive pattern 26 of the substrate 20 can have relatively small diameter. Accordingly, the semiconductor package 103 much thinner can be provided.

Referring to FIGS. 5 and 6A to 6J, one embodiment of a method for the manufacture of the present invention is illustrated. The semiconductor package is illustrated being turned upside down in FIGS. 6A to 6J differently from the one shown in FIGS. 1A to 4B, for convenience of explanation.

Figure 6A:
FIGS. 6A to 6J are cross-sectional views corresponding to the flow chart of FIG. 5 showing one embodiment of the method of a manufacture of the present invention.

In the first step S1 of providing the substrate 20 having the aperture 31 formed at the center thereof, as shown in FIG. 6A, the substrate 20 including the resin layer 23 having the first and second surfaces 21 and 22 that are approximately planar is prepared. The fine electrically conductive patterns 24 and 26 are formed on the first and second surfaces 21 and 22 of the resin layer 23. The electrically conductive patterns 24 and 26 of the first and second surfaces 21 and 22 of the resin layer 23 of the substrate 20 are connected to each other through the conductive via 27. In addition, the ball land 29, the bond finger 28 and the land 25 on which the insulating layer 30 is not coated are formed on the electrically conductive patterns 2 and 26. The aperture 31 with a predetermined area, in which a semiconductor chip that will be described below can be placed, penetrates the resin layer 23 at the center of the substrate 20.

Figure 6B:
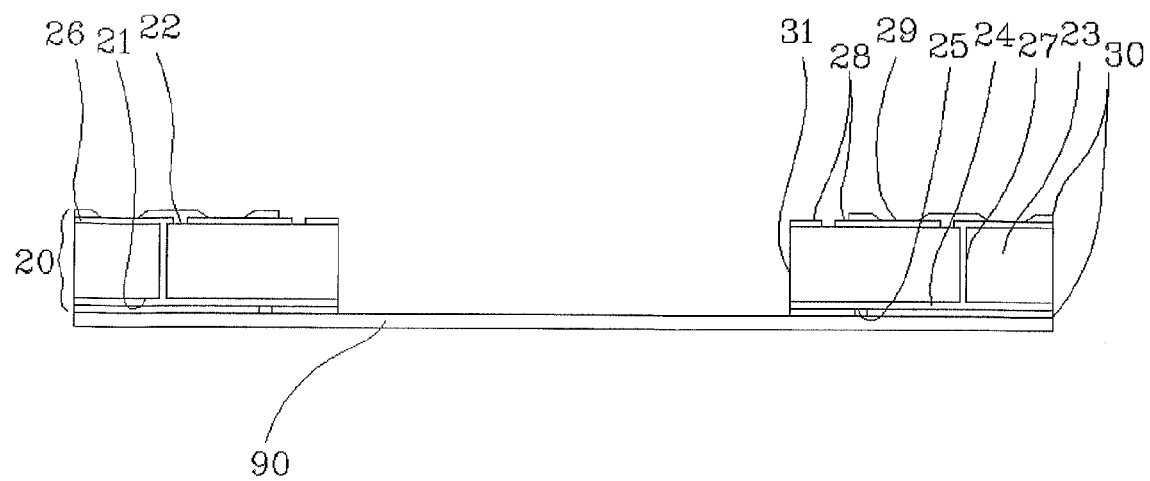

In the second step S2, the aperture 31 of the substrate 20 is covered using an adhesive tape 90 having the shape of an approximately planar plate, as shown in FIG. 6B. This adhesive tape 90 attaches the first semiconductor chip 1 to the semiconductor package during a chip mounting process to stably support the first semiconductor chip 1. The adhesive tape 90 further prevents the encapsulant from flowing towards the bottom of the first semiconductor chip 1 during a encapsulating process.

Figure 6C:
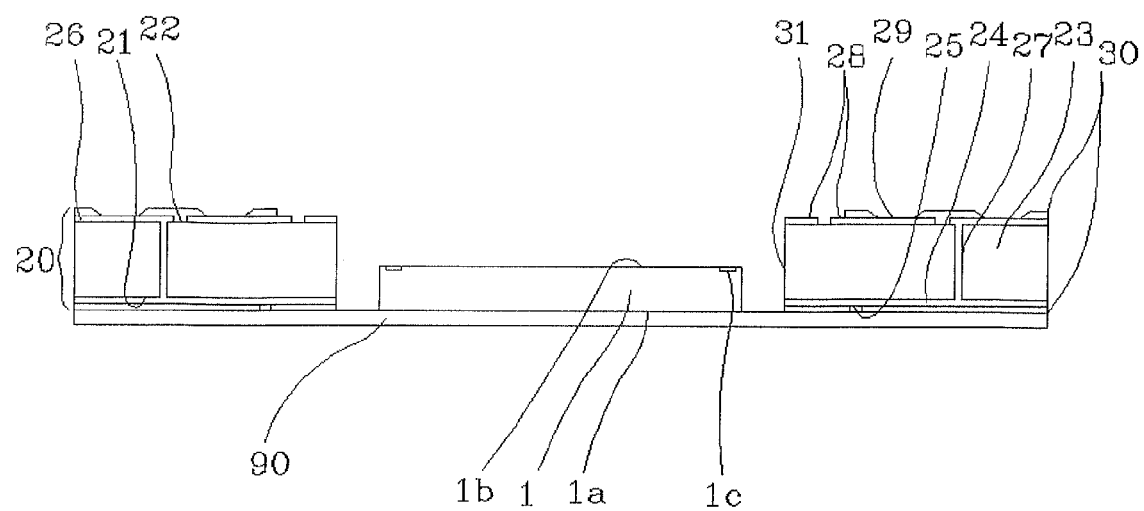

In the third step S3, the first semiconductor chip 1 is placed in the aperture 31 of the substrate 20. The first semiconductor chip 1 having the first and second surfaces 1a and 1b is attached onto the surface of the adhesive tape 90 formed at the aperture 31 of the substrate 20, as shown in FIG. 6C. The first semiconductor chip 1 has a plurality of input/output pads 1c formed on the edge of the second surface 1b.

Figure 6D:
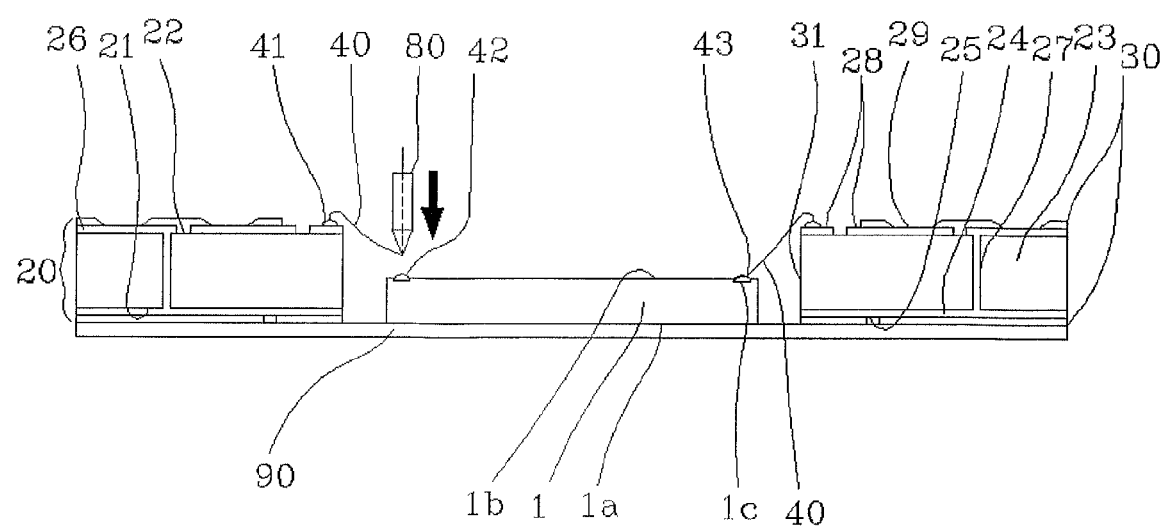

In the fourth step S4 for wire-bonding the bond finger 28 of the electrically conductive pattern 26 of the substrate 20 and the first semiconductor chip 1, one end of the first conductive wire 40 is ball-bonded 41 to the bond finger 28 of the electrically conductive pattern 26 of the substrate and the other end is stitch-bonded 43 to the input/output pads 1c of the first semiconductor chip 1. Specifically, the conductive ball 42 is formed on the input/output pads 1c of the first semiconductor chip 1. The conductive ball 42 is formed of gold, solder or its equivalent, but the material is not limited thereto. Then, one end of the first conductive wire 40 is ball-bonded 41 to the bond finger 28 of the electrically conductive pattern 26 of the substrate 20 and the other end is stitch-bonded 43 to the surface of the conductive ball 42 that was formed in advance. This wire bonding is carried out by using a capillary 80 of a wire bonder, as shown in FIG. 6D. According to this first wire bonding step, the maximum curved portion of the first conductive wire 40 is not placed at the second surface 1b of the first semiconductor chip 1 but at the electrically conductive pattern 26 of the substrate 20.

Figure 6E:
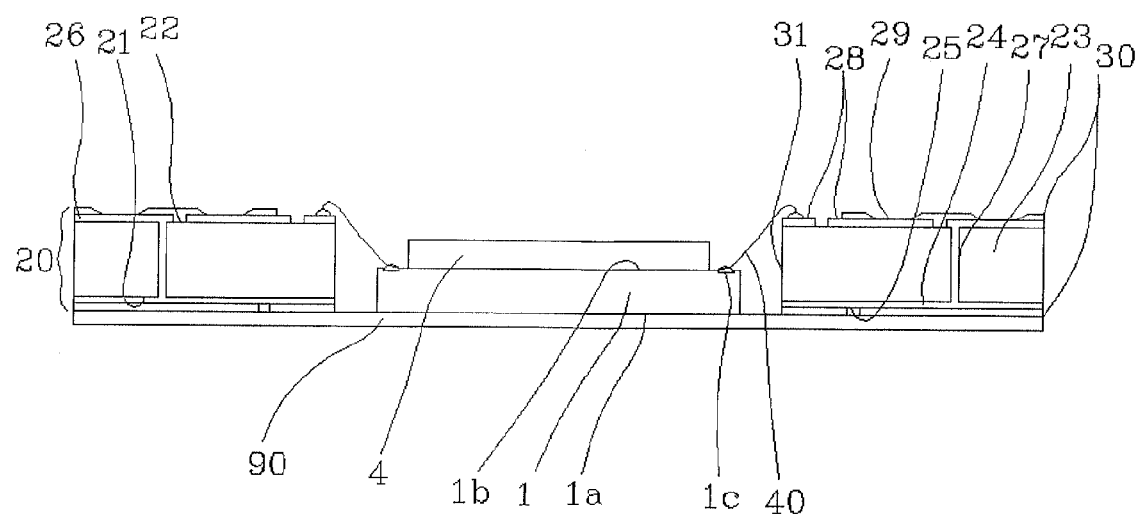

In the fifth step S5 of forming the adhesive layer 4 on the second surface 1b of the first semiconductor chip 1, the adhesive layer 4 (for example, film, tape, elastomer, epoxy or its equivalent) is attached onto the second surface 1b of the first semiconductor chip 1, as shown in FIG. 6E. Instead of the adhesive layer 4, silicon (not shown) may come into contact with the second surface 1b of the first semiconductor chip 1. Here, the adhesive layer 4 can be formed on a top and bottom surface of the silicon.

Figure 6F:
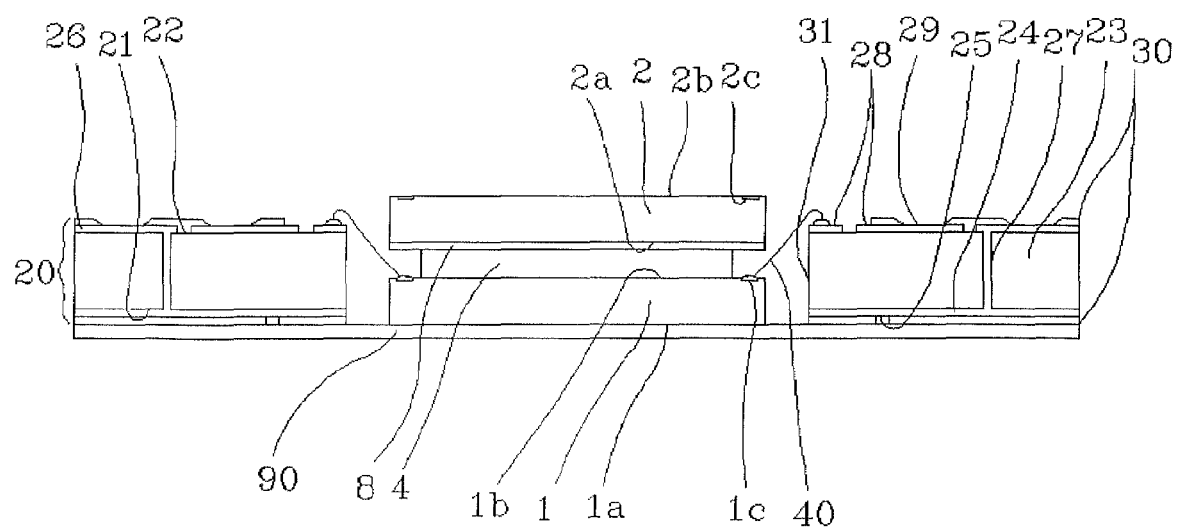

In the sixth step S6 of attaching the second semiconductor chip 2 onto the adhesive layer 4, the second semiconductor chip 2 having the insulating layer 8 formed on the first surface 1a thereof is attached to the adhesive layer 4, as shown in FIG. 6F. Here, it is preferable that the second semiconductor chip 2 is obtained in a manner that the insulating layer 8 is formed on a wafer and then the wafer is sawed into the second semiconductor chip. It is also possible that the wafer is cut into individual semiconductor chips and then the insulating layer 8 is formed on each of the semiconductor chips.

In the step of attachment of the second semiconductor chip 2, the first surface 2a of the second semiconductor chip 2 (specifically, the insulating layer 8) does not come into contact with the first conductive wire 40. That is, the maximum curved portion of the first conductive wire 40 is not located at the first semiconductor chip 1 but at the substrate 20, to reduce the probability of contact of the first conductive wire 40 and the first semiconductor chip 1. Accordingly, it is possible to use the second semiconductor chip 2 having a horizontal width wider than that of the first semiconductor chip 1. Furthermore, even when the first conductive wire 40 comes into contact with the adhesive layer 8 of the second semiconductor chip 2, the first conductive wire 40 is prevented from being damaged or short-circuited if the insulating layer 8 is formed of an insulating material with a certain degree of elasticity.

Figure 6G:
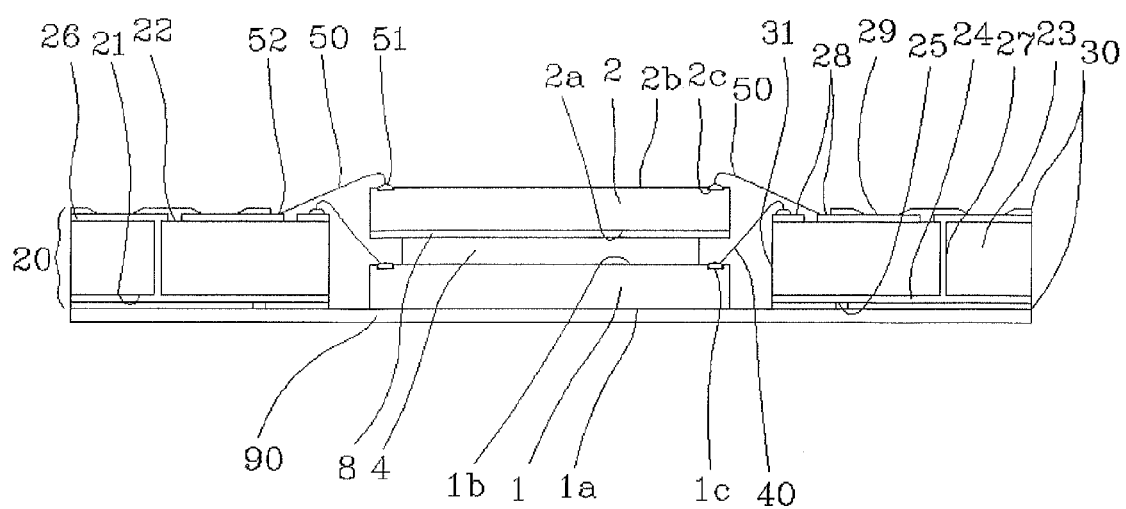

In the seventh step S7 of wire-bonding the input/output pads 2c of the second semiconductor chip 2 and the bond finger 28 of the electrically conductive pattern 26 of the substrate 20, one end of the second conductive wire 50 is ball-bonded 51 to the input/output pads 2c of the second semiconductor chip 2 and the other end is stitch-bonded 52 to the bond finger 28 of the electrically conductive pattern 26 of the substrate, as shown in FIG. 6G. Otherwise, a conductive ball (not shown) is formed on the input/output pads 2c of the second semiconductor chip 2 and then one end of the second conductive wire 50 is ball-bonded to the bond finger 28 of the electrically conductive pattern 26 and the other end is stitch-bonded to the conductive ball.

Figure 6H:
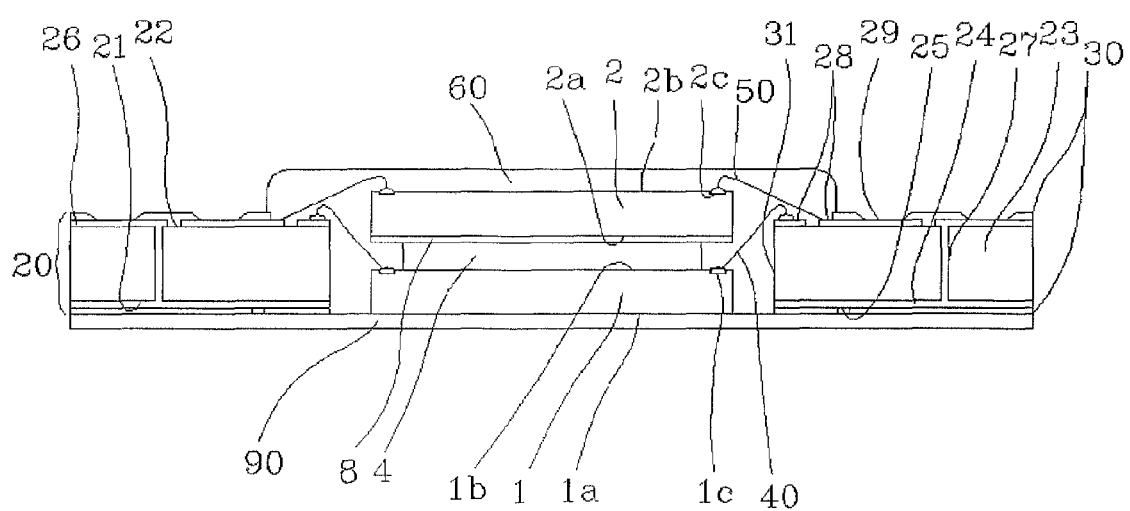

In the eighth step S8 of encapsulating up the first and second semiconductor chips 1 and 2 and the first and second conductive wires 40 and 50, the first and second semiconductor chips 1 and 2, the first and second conductive wires 40 and 50 and the adhesive layer 4 which are located in the aperture 31 of the substrate 20 are encapsulated up by using an encapsulant. As well known in the art, this encapsulating step is performed in a manner that the substrate 20 is placed in a mold (not shown) and then an epoxy molding compound with high-temperature and high-pressure is inserted into the mold, or liquid glop top is poured around the aperture 31 of the substrate 20 using a dispenser, to form the encapsulated portion 60 with a predetermined shape, as shown in FIG. 6H.

Figure 6I:
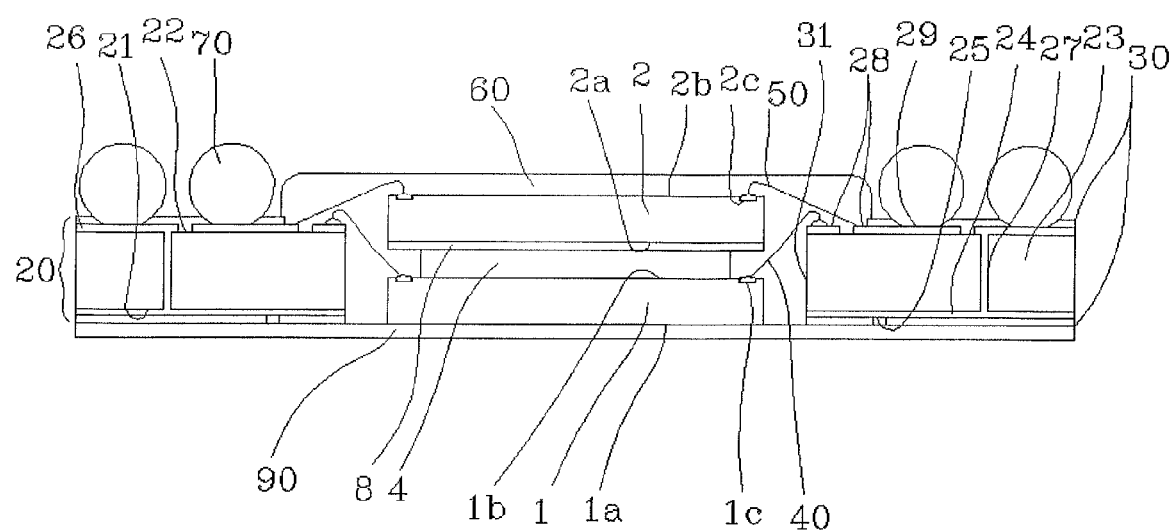

In the ninth step S9 of fusing the conductive ball 70 to the substrate 20, as shown in FIG. 6I, a flux is dotted on the exposed ball land 29 of the electrically conductive pattern 26 formed on the second surface 22 of the resin layer 23 of the substrate 20. Then, the conductive ball 70, such as solder ball, is put on the flux and introduced into a furnace with a high temperature so that the conductive ball 70 is fused to the ball land 29. Here, the flux temporarily fixes the conductive ball 70 and is volatilized in the furnace to be eliminated.

Figure 6J:
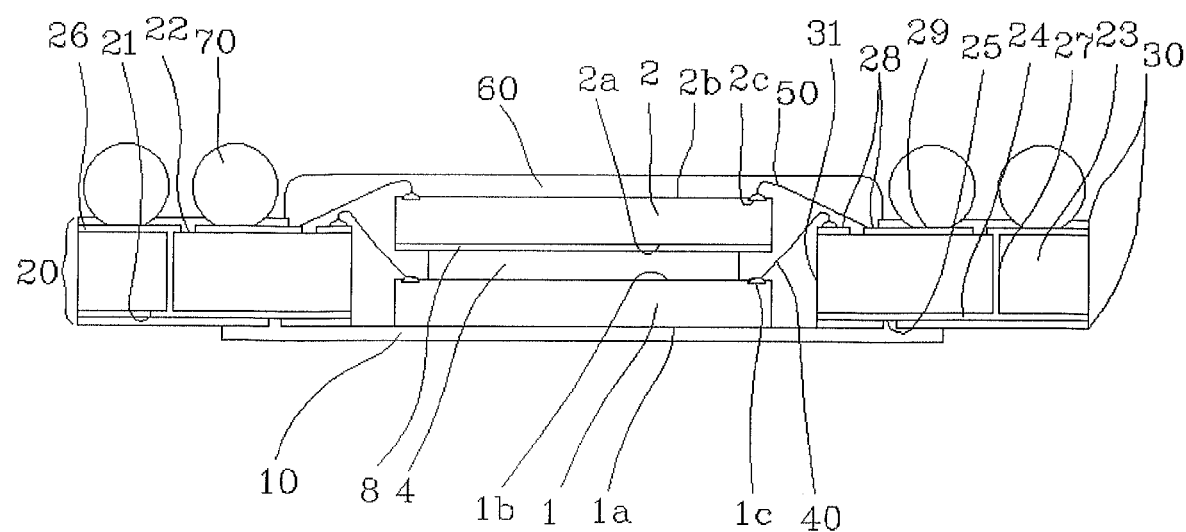

In the final step S10, as shown in FIG. 6J, the adhesive tape 90 is removed from the substrate 20 and the conductive thin film 10 is formed on the region from which the tape 90 was detached. The conductive thin film 10 can be formed by printing Ag-filled epoxy or attaching a plate-shaped thin film, for example, Cu, Al, Ag or its equivalent. Here, the conductive thin film 10 is electrically connected to the electrically conductive pattern 24 of the substrate 20. That is, the conductive thin film 10 is connected to the electrically conductive pattern 24 through the land 25 exposed from the solder mask 30.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a substrate having a resin layer with first and second surfaces wherein a plurality of electrically conductive patterns are formed thereon, the resin layer having an aperture formed in a central area thereof;
   a solder mask formed on the first and second surfaces of the substrate, the solder mask covering the electrically conductive patterns;
   a first semiconductor chip having first and second surfaces, the second surface having a plurality of input/output pads formed thereon, the first semiconductor chip being placed in the aperture of the substrate;
   a plurality of first conductive wires for connecting the input/output pads of the first semiconductor chip to the electrically conductive patterns formed on the resin layer;
   an adhesive attached to the second surface of the first semiconductor chip;
   a second semiconductor chip having first and second surfaces, the second surface having a plurality of input/output pads formed thereon, the second semiconductor chip being attached to the adhesive;
   a plurality of second conductive wires for connecting the input/output pads of the second semiconductor chip to the electrically conductive patterns formed on the resin layer;
   an encapsulate for encapsulating the aperture, the first and second semiconductor chips, and the first and second conductive wires; and a conductive thin film extending across the aperture of the substrate and coupled to the first side of the first semiconductor chip and the solder mask formed on the first surface of the substrate, the conductive thin film electrically coupled to the electrically conductive patterns formed on the first surface of the substrate through openings formed in the solder mask.

2. The semiconductor package in accordance with claim 1 wherein each of first conductive wires are stand off stitch bonded.

3. The semiconductor package in accordance with claim 1 wherein one end of each first conductive wire is ball-bonded to one of the electrically conductive patterns and the other end is stitch-bonded to one of the input/output pads of the first semiconductor chip.

4. The semiconductor package in accordance with claim 3 wherein a conductive ball is coupled to the input/output pad of the first semiconductor chip and the first conductive wire is stitch-bonded to the conductive ball.

5. The semiconductor package in accordance with claim 3 wherein each of the plurality of second conductive wires for connecting the input/output pads of the second semiconductor chip to the electrically conductive patterns on the resin layer of the substrate are normal wire bonded.

6. The semiconductor package in accordance with claim 3 wherein one end of each second conductive wire is ball-bonded to one of the electrically conductive patterns and the other end is stitch-bonded to one of the input/output pads of the second semiconductor chip.

7. The semiconductor package in accordance with claim 6 wherein a conductive ball is fused to the input/output pad of the second semiconductor chip and the second conductive wire is stitch-bonded to the conductive ball.

8. The semiconductor package in accordance with claim 1 wherein the conductive thin film absorbs electromagnetic waves.

9. The semiconductor package in accordance with claim 8 wherein the electrically conductive patterns are formed on the first and second surfaces of the resin layer and are connected through at least one conductive via.

10. The semiconductor package in accordance with claim 9 wherein the electrically conductive patterns formed on the second surface of the resin layer are electrically connected to the conductive thin film.

11. The semiconductor package in accordance with claim 1 wherein the adhesive is silicon having an adhesive layer formed on a top and bottom surface thereon.

12. The semiconductor package in accordance with claim 1 wherein the second semiconductor chip has an insulating layer formed on the first surface thereof.

13. The semiconductor package in accordance with claim 1 wherein the horizontal width of the second semiconductor chip is wider than that of the first semiconductor chip.

14. A semiconductor package, comprising:
a substrate having a resin layer with first and second surfaces wherein a plurality of electrically conductive patterns are formed thereon, the resin layer having an aperture formed at a central area thereof;
a solder mask formed on the first and second surfaces of the substrate, the solder mask covering the plurality of electrically conductive patterns;
a first semiconductor chip having first and second surfaces, the second surface having a plurality of input/output pads formed thereon, the first semiconductor chip being placed in the aperture of the substrate;
a plurality of first conductive wires for connecting the input/output pads of the first semiconductor chip to the electrically conductive patterns formed on the resin layer;
a second semiconductor chip having first and second surfaces, the second surface having a plurality of input/output pads formed thereon;
means coupled to the second surface of the first semiconductor chip for coupling the first semiconductor chip to the second semiconductor chip;
a plurality of second conductive wires for connecting the input/output pads of the second semiconductor chip to the electrically conductive patterns formed on the resin layer;
means for encapsulating the aperture of the substrate, the first and second semiconductor chips, and the first and second conductive wires; and
a conductive thin film extending across the aperture of the substrate and coupled to the solder mask formed on the first surface of the substrate, the conductive thin film electrically coupled to the electrically conductive patterns formed on the first surface of the substrate through openings formed in the solder mask.

15. The semiconductor package in accordance with claim 14 wherein one end of each first conductive wire is ball-bonded to one of the electrically conductive patterns and the other end is stitch-bonded to one of the input/output pads of the first semiconductor chip so that a curved portion of the first conductive wire is placed on the electrically conductive pattern.

16. The semiconductor package in accordance with claim 14 wherein one end of each second conductive wire is ball-bonded to one of the electrically conductive patterns and the other end is stitch-bonded to one of the input/output pads of the second semiconductor chip so that a curved portion of the second conductive wire is placed on the electrically conductive pattern.

17. The semiconductor package in accordance with claim 14 wherein the conductive thin film absorbs electromagnetic waves and dissipates heat from the first semiconductor device.

18. The semiconductor package in accordance with claim 17 wherein the electrically conductive patterns formed on the second surface of the resin layer are electrically connected to the conductive thin film.

19. The semiconductor package in accordance with claim 14 wherein the second semiconductor chip has an insulating layer formed on the first surface thereof.

* * * * *